United States Patent
Chen et al.

(10) Patent No.: US 10,312,242 B2
(45) Date of Patent: Jun. 4, 2019

(54) SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tzu-Chieh Chen, Pingtung County (TW); Pin-Hong Chen, Tainan (TW); Chih-Chieh Tsai, Kaohsiung (TW); Chia-Chen Wu, Nantou County (TW); Yi-An Huang, New Taipei (TW); Kai-Jiun Chang, Taoyuan (TW); Tsun-Min Cheng, Changhua County (TW); Yi-Wei Chen, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/986,780

(22) Filed: May 22, 2018

(65) Prior Publication Data
US 2019/0013320 A1 Jan. 10, 2019

(30) Foreign Application Priority Data
Jul. 7, 2017 (CN) .......................... 2017 1 0549860

(51) Int. Cl.
*H01L 23/31* (2006.01)
*H01L 27/108* (2006.01)

(52) U.S. Cl.
CPC .... *H01L 27/10814* (2013.01); *H01L 23/3192* (2013.01); *H01L 27/10823* (2013.01); *H01L 27/10894* (2013.01); *H01L 27/10897* (2013.01)

(58) Field of Classification Search
CPC . H01L 51/0072; H01L 51/56; H01L 51/5072; H01L 51/5056; C09K 11/06
USPC ........................................................ 257/306
See application file for complete search history.

(56) References Cited

U.S. PATENT DOCUMENTS

| | | |
|---|---|---|
| 5,122,477 A | 6/1992 | Wolters et al. |
| 5,396,095 A | 3/1995 | Wolters et al. |
| 5,955,774 A | 9/1999 | Kang |
| 6,602,756 B2 | 8/2003 | Lin et al. |
| 6,642,100 B2 | 11/2003 | Yang et al. |
| 7,723,770 B2 | 5/2010 | Choi et al. |
| 9,111,953 B2 | 8/2015 | Park et al. |

(Continued)

*Primary Examiner* — Andy Huynh
(74) *Attorney, Agent, or Firm* — Winston Hsu (57) ABSTRACT

A semiconductor memory device is provided, and which includes a substrate, plural gates, plural plugs, a capacitor structure and a conducting cap layer. The gates are disposed within the substrate, and the plugs are disposed on the substrate, with each plug electrically connected to two sides of each gate on the substrate. The capacitor structure is disposed on the substrate, and the capacitor structure includes plural capacitors, with each capacitor electrically connected to the plugs respectively. The conducting cap layer covers the top surface and sidewalls of the capacitor structure. Also, the semiconductor memory device further includes an adhesion layer and an insulating layer. The adhesion layer covers the conducting cap layer and the capacitor structure, and the insulating layer covers the adhesion layer.

9 Claims, 6 Drawing Sheets

(56) References Cited

U.S. PATENT DOCUMENTS

2002/0019107 A1\* 2/2002 Lin ......................... H01L 28/91
  438/396
2005/0045990 A1 3/2005 Nakao et al.

\* cited by examiner

SEMICONDUCTOR MEMORY DEVICE

BACKGROUND OF THE INVENTION

1. Field of the Invention

The present invention relates to a semiconductor memory device, and more particularly, to a dynamic random access memory (DRAM) device.

2. Description of the Prior Art

Dynamic random access memory (DRAM) is a kind of volatile memory and an indispensable key component in many electronic products. DRAM which is arranged from a large number of memory cells to form an array area for save information. Each memory cell consists of a metal oxide semiconductor (MOS) transistor and a capacitor in series.

As the accumulation of DRAMs increases, it becomes more difficult to establish an electrical connection between each memory cell and each memory cell. At the same time, there are many different structural designs for the crystal structure and capacitor structure in each memory cell due to product requirements or/and density of memory cells. Therefore, how to develop a DRAM structure with maintaining performance and manufacturing process has always been the technical direction of continuous efforts in the field.

SUMMARY OF THE INVENTION

It is one of the primary objectives of the present invention to provide a semiconductor memory device, in which an adhesive layer is additionally disposed on a capacitor structure to enhance the binding between a conductive cover layer and an insulating layer over the capacitor structure, so as to improve the device performance of the semiconductor memory device.

To achieve the purpose described above, the present invention provides a semiconductor memory device including a substrate, a plurality of gates, a plurality of plugs, a capacitor structure, a conductive cover layer, an adhesive layer and an insulating layer. The gates are disposed within the substrate. The plugs are electrically connected to the substrates at two sides of the gates, respectively. The capacitor structure is disposed on the substrate, and includes a plurality of capacitors with each of the capacitors being electrically connected to the plugs, respectively. The conductive cover layer covers a top surface and sidewalls of the capacitor structure, the adhesive layer covers the conductive cover layer and the capacitor structure, and the insulating layer covers the adhesive layer.

Overall speaking, the present invention additionally provides an adhesive layer formed on the capacitor structure, and the adhesion layer may optionally include a monolayer structure or a multilayer structure. The adhesion layer is formed between the conductive cover layer and the insulating layer over the capacitor structure, and which preferably includes an adhesive material like titanium, titanium nitride, tantalum, tantalum nitride, aluminum, tungsten nitride, or cobalt, so as to improve the binding force between the conductive cover layer and the insulating layer. In this way, it is sufficient to avoid any possible pealing or collapse of the capacitor structure or the stacked layers on the capacitor structure, and to gain a better performance to the semiconductor memory device thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a method of forming a semiconductor memory device according to a first embodiment of the present invention, in which:

FIG. 4 to FIG. 5 are schematic diagrams illustrating a method of forming a semiconductor memory device according to a second embodiment of the present invention, in which:

DETAILED DESCRIPTION

To provide a better understanding of the presented invention, preferred embodiments will be described in detail. The preferred embodiments of the present invention are illustrated in the accompanying drawings with numbered elements.

Figure 1:
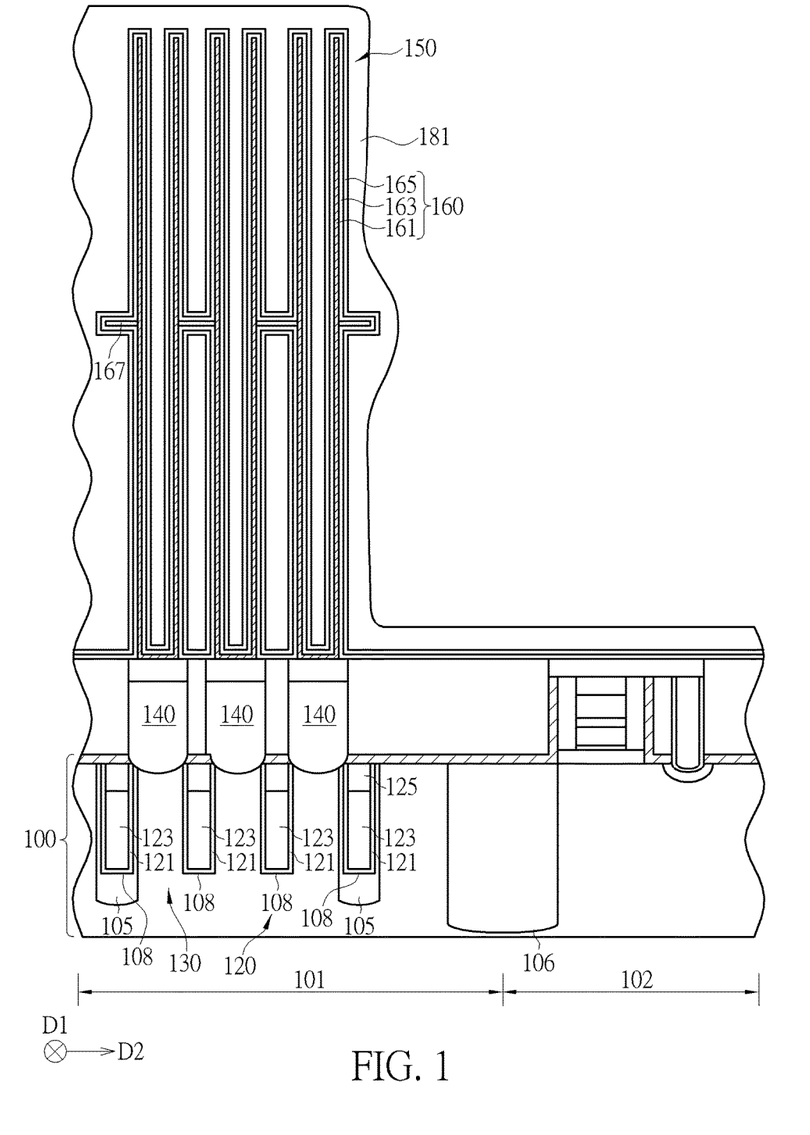
FIG. 1 shows a cross-sectional view of a semiconductor memory device after forming storage nodes.
Figure 2:
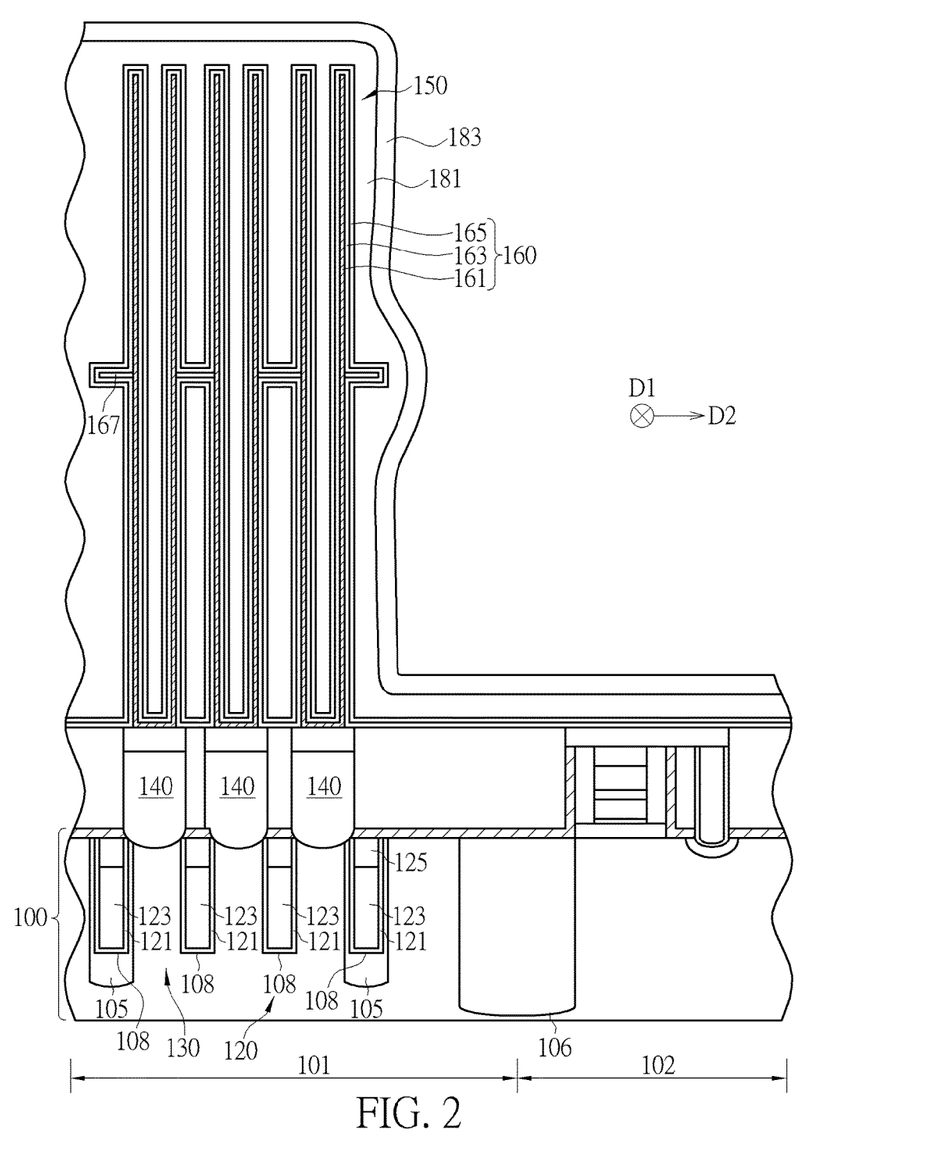
FIG. 2 shows a cross-sectional view of a semiconductor memory device after forming an adhesive layer.
Figure 3:
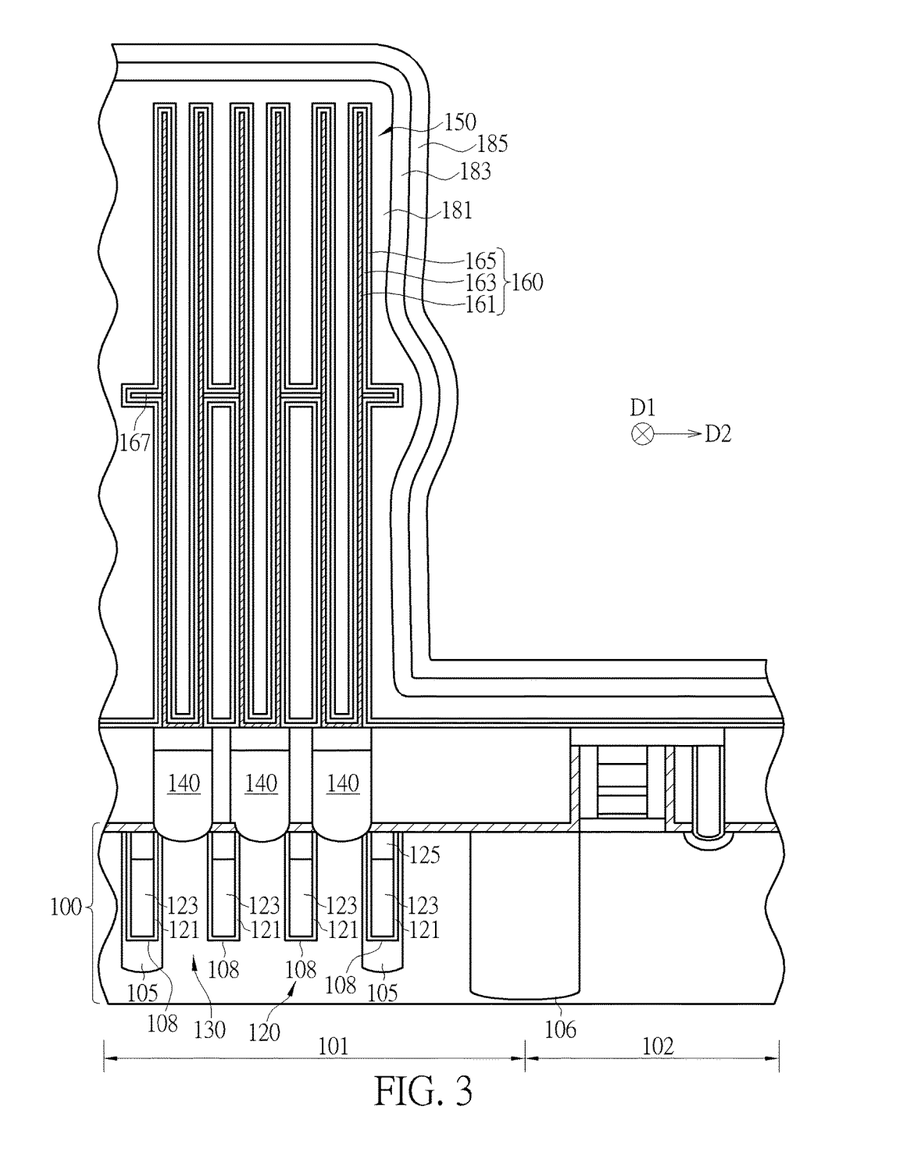
FIG. 3 shows a cross-sectional view of a semiconductor memory device after forming an insulating layer.

Please refer to FIG. 1 to FIG. 3, which are schematic diagrams illustrating a forming process of a semiconductor memory device according to the first embodiment of the present invention. The semiconductor memory device for example includes a dynamic random access memory (DRAM) device, and which includes at least one transistor 130 and at least one capacitor 160, thereto serve as the smallest unit in the DRAM array for accepting signals from word lines (WLs) 120 and bit lines (BLs, not shown in the drawings) during the operation.

In the present embodiment, the semiconductor memory device includes a substrate 100 such as a silicon substrate, a silicon-containing substrate like a SiC or SiGe substrate, or a silicon-on-insulator (SOI) substrate, and a cell region 101 and a periphery region 102 are defined on the substrate 100. Also, at least one shallow trench isolation (STI) 105, 106 is formed in the substrate 100.

Furthermore, the shallow trench isolation 105 may be formed within the cell region 101 of the substrate 100, thereto define a plurality of active areas (AAs, not shown in the drawings) in the cell region 101. On the other hand, the shallow trench isolation 106 may be further formed between the cell region 101 and the periphery region 102, so as to isolating the two regions 101, 102. The formations of the shallow trench isolations 105, 106 are for example accomplished by first performing an etching process to form a plurality of trenches in the substrate 100, followed by filling an insulating material such as silicon oxide (SiO), silicon nitride (SiN) or silicon oxynitride (SiON) to form the shallow trench isolations 105, 106.

The substrate 100 further includes a plurality of word lines such as the buried word lines 120 preferably as shown in FIG. 1, the word lines are formed in the substrate 100 within the cell region 101. In the present embodiment, each of the buried word lines 120 are parallel extended along a first direction (such as a y-direction) D1 to cross each of the active areas and the shallow trench isolation 105, so that, a portion of each buried word line 120 may therefore embedded in the shallow trench isolation 105, and another portion of each buried word line 120 may be formed within each active area, as shown in FIG. 1.

Precisely, each of the buried word lines 120 at least includes a gate dielectric layer 121 such as including silicon oxide, a gate layer 123 such as including a low-resistant metal like tungsten (W), aluminum (Al) or copper (Cu), and a cover layer 125 such as including an insulating material like silicon nitride, silicon oxynitride or silicon carbonitride (SiCN). The formations of the aforementioned gate dielectric layer 121, the gate layer 123 and the cover layer 125 are accomplished by first forming a plurality of trenches 108, followed by performing a deposition process, an etching process and a planarization process to sequentially form the gate dielectric layer 121 covering the entire surfaces of each trench 108, the gate layer 123 filling in a bottom portion of each trench 108, and the cover layer 125 filling in a top portion of each trench 108, in each trench 108. Then, the cover layer 125 filled in each trench 108 may therefore level with a top surface of the substrate 100. In the present embodiment, each of the buried word lines 120 and a doped region (not shown in the drawings) formed at two sides therefore in the substrate 100 may together form a transistor 130 as shown in FIG. 1.

Then, a capacitor structure 150 is formed on the substrate 100 within the cell region 101, and which includes a plurality of capacitors 160. Each of the capacitors 160 is electrically connected to the doped region of each transistor 130 respectively through a plurality of contact plugs 140 and a silicide layer (not shown in the drawings) disposed under each capacitors 160, so that, each of the capacitors 160 may function like a storage node (SN). In this way, each capacitor 160 and each transistor 130 formed in the substrate 100 may together form each cell unit to consist the DRAM array. Precisely, each capacitor 160 includes a bottom electrode 161, a capacitor dielectric layer 163 such as including a dielectric material like hafnium oxide ($HfO_2$) with a dielectric constant greater than 4, and a top electrode 165 stacked one over another. The bottom electrode 161 and the top electrode 165 for example both include a conductive material like tungsten, titanium (Ti), titanium nitride (TiN), tantalum (Ta), tantalum nitride (TaN) or aluminum (Al).

In the present embodiment, a support layer 167 is preferable formed additionally on each capacitor 160, and which may be disposed to in connection with each capacitor 160 along a second direction (such as a x-direction) D2, for avoiding any possible breaks or damages on the capacitor 160 with a high aspect ratio, during the forming process thereof. It is noted that, although the present embodiment is exemplified by forming the supporting layer 167 at the middle portion of each capacitor 160 for providing better supporting, the precise forming number and the forming portion of the supporting layer are not limited thereto. For example, in another embodiment, two supporting layers (not shown in the drawings) may be formed, with one of the two supporting layers being disposed in connection with the middle portion of each capacitor 160 and with another one of the two supporting layers being disposed in connection with the top portion of each capacitor 160, for further providing a preferably supporting to the structure of each capacitor 160. The supporting layer 167 preferably includes a dielectric material such as silicon nitride, but is not limited thereto.

Next, a deposition process such as a chemical vapor deposition (CVD) is performed, to forma semiconductor layer 181 on the capacitor structure 150, the semiconductor layer 181 for example includes a semiconductor material like polysilicon. The semiconductor layer 181 entirely covers the substrate 100 and the capacitor structure 150, to directly in contact with the capacitor structure 150 and to further fill in gaps between each capacitor 160, as shown in FIG. 1. In the present embodiment, the semiconductor layer 181 is conformally formed on top surface and sidewalls of the capacitor structure 150, so that, a portion of the semiconductor layer 181 which directly contacts the supporting layer 167 may therefore obtain a relative greater thickness. In other words, although the semiconductor layer 181 simultaneously covers the top surface and the sidewalls of the capacitor structure 150, the portion of the semiconductor layer 181 covering on the top surface of the capacitor structure 150 may obtain a uniform and planar surface, and the portion of the semiconductor layer 181 covering on the sidewalls of the capacitor structure 150 may further covers the supporting layer 167 to obtain a uneven surface, as shown in FIG. 7.

Furthermore, a deposition process such as a physical vapor deposition (PVD) is performed, to form a conductive cover layer 183 on the semiconductor layer 181, and the conductive cover layer 183 for example includes a low-resistant metal material like tungsten or copper. In the present embodiment, the conductive cover layer 183 is also conformally formed on the substrate 100 and the capacitor structure 150, so that, a portion of the conductive cover layer 183 covering on the sidewalls of the capacitor structure 150 may also obtain a uneven surface, as shown in FIG. 2.

Next, an insulating layer 185 such as including a dielectric material like undoped silicon glass (USG), but not limited thereto. In the present embodiment, the insulating layer 185 is also conformally formed on the substrate 100 and the capacitor structure 150, so that, a portion of the insulating layer 185 covering on the sidewalls of the capacitor structure 150 may also obtain a uneven surface, as shown in FIG. 3.

Through above steps, the method of forming a semiconductor memory device according to the first preferred embodiment of the present invention is accomplished. In the present embodiment, at least one supporting layer 167 is additionally formed on each capacitor 160 with a high aspect ratio for maintain the integrity of the capacitor structure 150, thereby avoiding any possible breaks or damages on the capacitor 160 during the forming process thereof. According to the present embodiment, the semiconductor layer 181 formed sequentially directly contacts the capacitor structure 150 to cover the capacitor structure 150. The semiconductor layer 181 covering on the supporting layer 167 may include a relative greater thickness, so that, the portion of the semiconductor layer 181 covering on the sidewalls of the capacitor structure 150 may therefore obtain a uneven surface. Thus, the subsequent formed conductive cover layer 183 and the insulating layer 185 covering on the capacitor structure 150 and the semiconductor layer 181 may also include uneven surfaces while covering on the sidewalls of the capacitor structures 150. Moreover, in the present embodiment, the subsequent formed conductive cover layer 183 and the insulating layer 185 are directly in contact with each other. In some situation, the poor binding between the conductive cover layer 183 and the insulating layer 185 may lead to structure collapse, resulting in poor performance of the semiconductor memory device thereby.

The following description will detail the different embodiments of the semiconductor memory device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
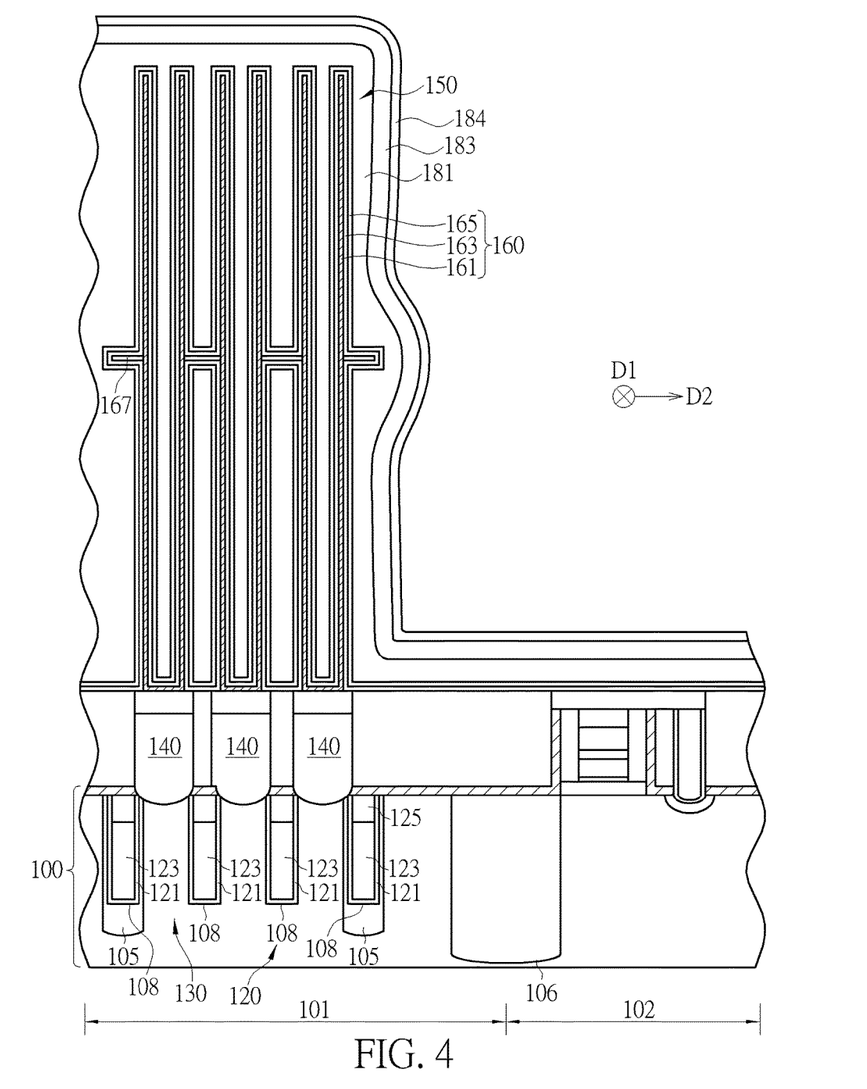
FIG. 4 shows a cross-sectional view of a semiconductor memory device after forming a conductive cover layer.
Figure 5:
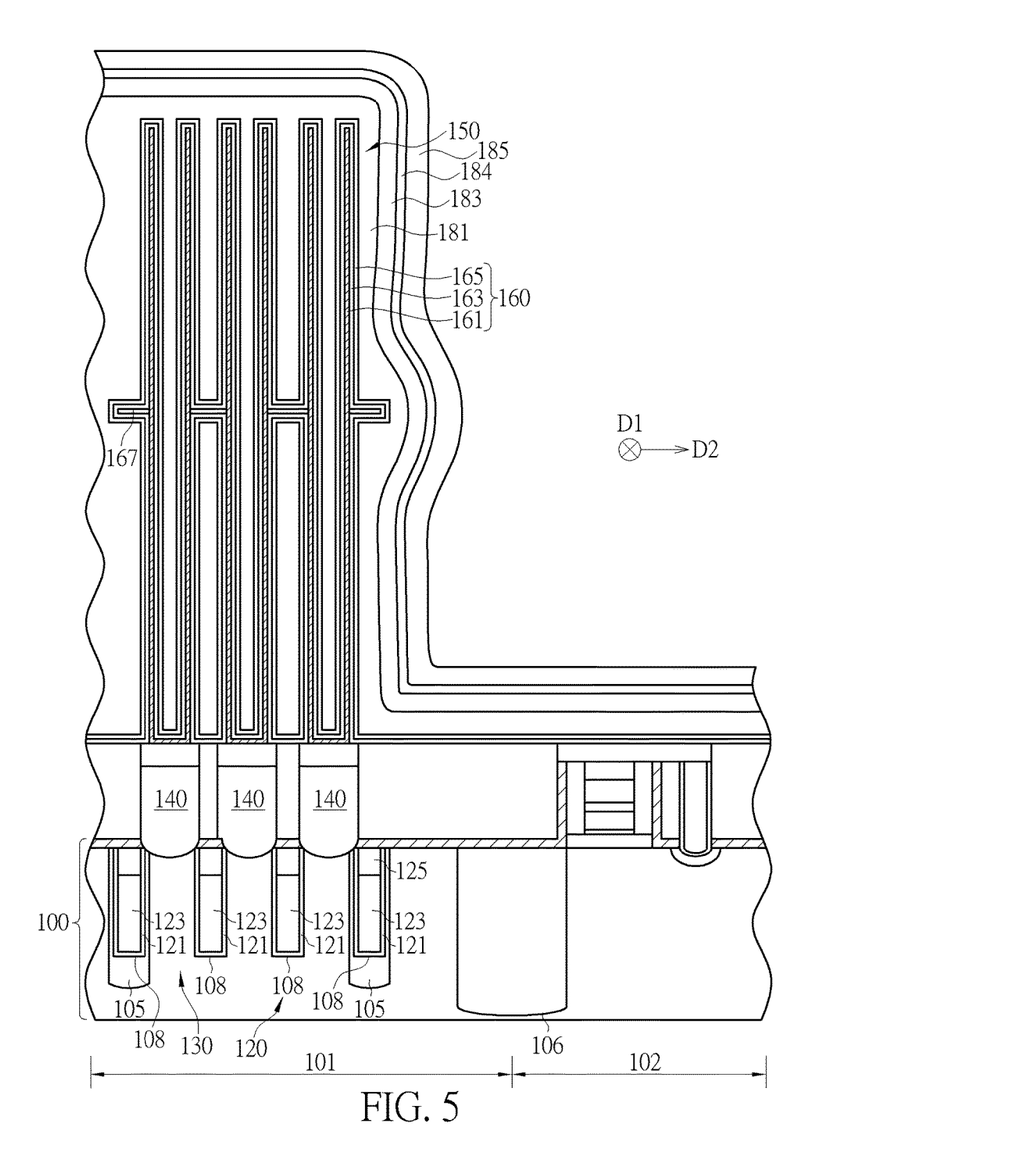
FIG. 5 shows a cross-sectional view of a semiconductor memory device after forming an insulating layer.

Please refer to FIG. 4 to FIG. 5, which are schematic diagrams illustrating a forming process of a semiconductor memory device according to the second embodiment of the present invention. The formal steps in the present embodiment are similar to those in the first embodiment as shown in FIGS. 1-3, and which may be redundantly described herein. The differences between the present embodiment and the aforementioned first embodiment are that, an adhesion layer 184 is additionally formed on the conductive cover layer 183.

Figure 6:
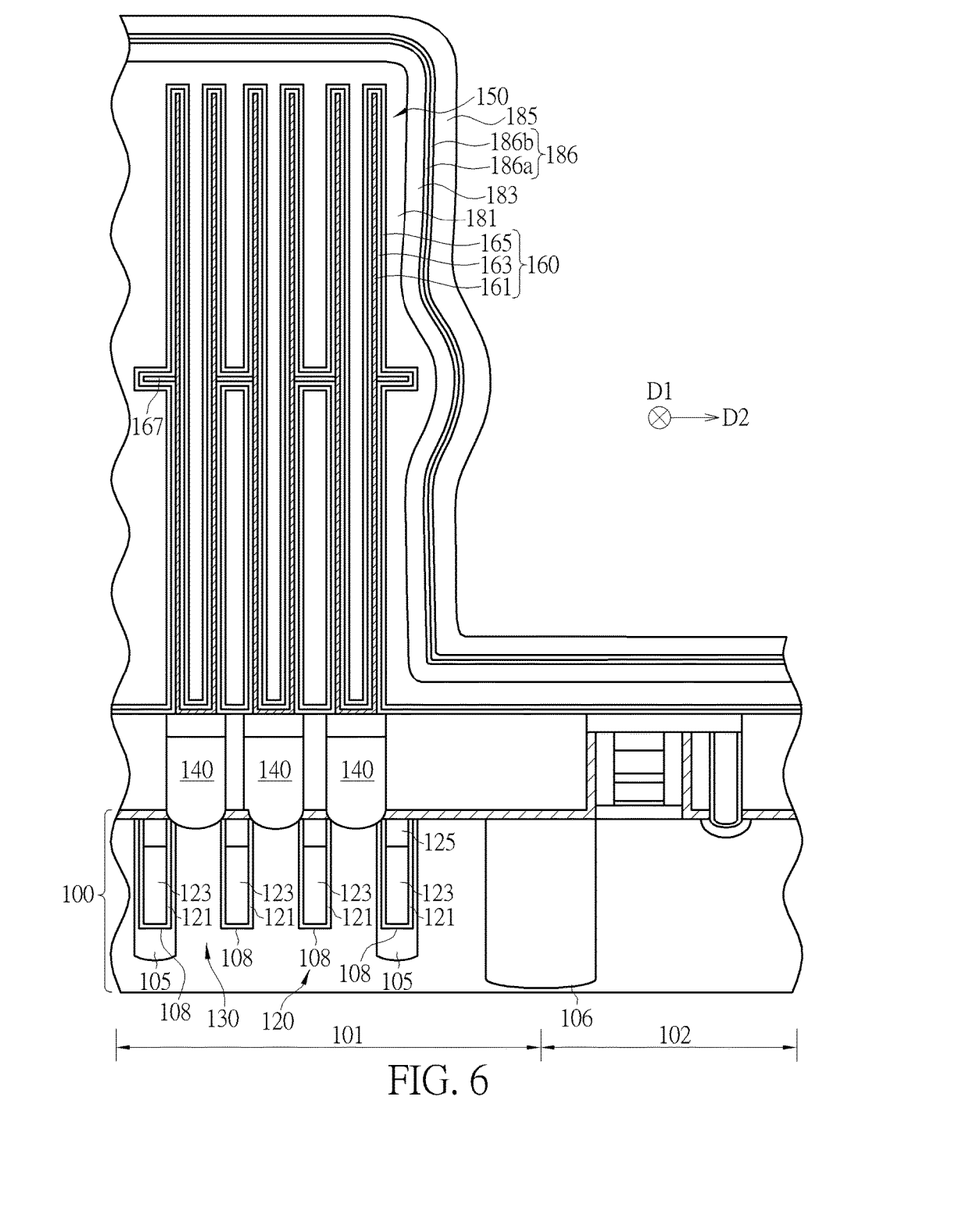
FIG. 6 shows a cross-sectional view of a semiconductor memory device according to another embodiment of the present invention.

Precisely, the adhesion layer 184 is formed on the substrate 100 and the capacitor structure 150, as shown in FIG. 4, and then, the insulating layer 185 is formed. In other words, the adhesion layer 184 is formed over the capacitor structure 150, between the conductive cover layer 183 and the insulating layer 185, as shown in FIG. 5. In one embodiment, the adhesion layer 184 may include titanium (Ti), titanium nitride (TiN), tantalum (Ta), tantalum nitride (TaN), aluminum, cobalt (Co) or tungsten nitride (WN), so as to enhance the binding between the conductive cover layer 183 and the insulating layer 185. It is noted that, although the present embodiment is exemplified by forming the adhesion layer 184 in a monolayer structure, the practical forming number and the material thereof is not limited thereto and which may further adjust based on the product requirements. For example, in another embodiment, an adhesion layer having a multilayer structure may be formed, such as an adhesion layer 186 as shown in FIG. 6. The adhesion layer 186 includes a first adhesion layer 186a and a second adhesion layer 186b, and the first adhesion layer 186a and the second adhesion layer 186b may both include a material selected from a group of titanium, titanium nitride, tantalum, tantalum nitride, aluminum, cobalt and tungsten nitride. In one embodiment, the first adhesion layer 186a and the second adhesion layer 186b may include different materials, or include the same material with different elemental ratio. Also, in another embodiment, the adhesion layer may further include more than two layers, for further enhance the binding between the conductive cover layer 183 and the insulating layer 185.

Through above steps, the method of forming a semiconductor memory device according to the second preferred embodiment of the present invention is accomplished. In the present embodiment, the adhesion layer 184 with a monolayer structure or the adhesion layer 186 with a multilayer structure is additionally formed on the capacitor structure 150. The adhesion layers 184, 186 may preferably include an adhesive material like titanium, tantalum nitride, aluminum, cobalt or tungsten nitride, so that, the adhesion layers 184, 186 may enhance the binding between the conductive cover layer 183 and the insulating layer 185 while disposing the adhesion layers 184, 186 on the capacitor structure 150, between the conductive cover layer 183 and the insulating layer 185. Thus, it is sufficient to avoid possible pealing of collapse of the stacked layers (such as the semiconductor layer 181, the conductive cover layer 183 and the insulating layer 185) on the cell region 101 due to the significant height different between the cell region 101 and the periphery region 102, while the subsequent planarization process such as the chemical mechanical planarization (CMP) process and etching process is performed. In this way, the element performance of the semiconductor memory device is improved accordingly.

Overall speaking, a reinforcement structures like a supporting layer or an adhesion layer is optionally formed either within the capacitor structure or over the capacitor structure of the semiconductor memory device. The supporting layer is for example formed on each capacitor with a high aspect ratio, preferably at the middle portion or the top portion of each capacitor, for avoiding any possible breaks or damages of each capacitor. The adhesion layer is for example formed between the conductive cover layer and the insulating layer over the capacitor structure, and which may include monolayer structure or a multilayer structure which preferably include an adhesive material like titanium, tantalum nitride, aluminum, cobalt, or tungsten nitride. That is, the adhesion layer is sufficient to enhance the binding between the conductive cover layer and the insulating layer, so as to avoid any possible pealing or collapse of the capacitor structure and the stacked layers formed on the capacitor structure. Through this arrangement, the present invention is able to improve possible structure defects of the semiconductor memory device, to gain a better performance thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a plurality of gates disposed within the substrate;
   a plurality of plugs disposed on the substrate, the plugs electrically connected to the substrate at two sides of the gate, respectively;
   a capacitor structure disposed on the substrate, the capacitor structure comprising a plurality of capacitors, each of the capacitors electrically connected to the plugs respectively;
   a semiconductor layer covering on the capacitor structure and directly in contact with the capacitor structure, where a portion of the semiconductor layer is filled between the capacitors;
   a conductive cover layer covering on a top surface and insidewalls of the capacitor structure;
   an adhesive layer covering on the conductive cover layer and the capacitor structure; and
   an insulating layer covering the adhesive layer.

2. The semiconductor memory device according to claim 1, wherein the adhesive layer comprises titanium, titanium nitride, tantalum, tantalum nitride, aluminum, tungsten nitride, or cobalt.

3. The semiconductor memory device according to claim 1, wherein the adhesive layer comprises a multilayer structure.

4. The semiconductor memory device according to claim 3, wherein the multilayer structure is selected from a group consisted of titanium, titanium nitride, tantalum, tantalum nitride, aluminum, tungsten nitride, and cobalt.

5. The semiconductor memory device according to claim 1, wherein another portion of the semiconductor layer covering on the sidewall of the capacitor structure has a greater thickness.

6. The semiconductor memory device according to claim 1, wherein another portion of the semiconductor layer covering on the sidewall of the capacitor structure has an uneven surface.

7. The semiconductor memory device according to claim 6, wherein the conductive cover layer and the adhesive are conformally disposed on the semiconductor layer.

8. The semiconductor memory device according to claim 1, wherein each of the capacitor comprises a lower electrode, a capacitor dielectric layer and an upper electrode, and each of the lower electrodes contacts the plugs.

9. The semiconductor memory device according to claim 1, wherein the insulating layer comprise silicon oxide.

* * * * *